(12) United States Patent
Timmermans et al.

(10) Patent No.: US 7,330,135 B2
(45) Date of Patent: Feb. 12, 2008

(54) METHOD AND A DEVICE FOR READING OUT KEYBOARD KEYS

(75) Inventors: Peter Timmermans, Brussels (BE); Mark Vanophalvens, Brussels (BE)

(73) Assignee: Atos Worldline SA, Brussels (BE)

( * ) Notice: Subject to any disclaimer, the term of this patent is extended or adjusted under 35 U.S.C. 154(b) by 149 days.

(21) Appl. No.: 11/017,926

(22) Filed: Dec. 22, 2004

(65) Prior Publication Data

US 2005/0179566 A1  Aug. 18, 2005

(30) Foreign Application Priority Data

Dec. 22, 2003  (EP)  ................... 03079008

(51) Int. Cl.
*H03M 11/00* (2006.01)

(52) U.S. Cl. ............... 341/26; 341/22; 341/20; 340/825

(58) Field of Classification Search ............ 341/26, 341/21, 22, 23, 25, 27, 34, 31; 340/5.21, 340/825; 379/368

See application file for complete search history.

(56) References Cited

U.S. PATENT DOCUMENTS

| 5,025,255 | A  | 6/1991 | Mould |
| 5,754,652 | A  | 5/1998 | Wilfong |
| 6,054,940 | A  | 4/2000 | Greene |
| 6,246,769 | B1 | 6/2001 | Kohut |
| 6,583,712 | B1 | 6/2003 | Reed et al. |

FOREIGN PATENT DOCUMENTS

EP  0 368 520  5/1990

*Primary Examiner*—Jeffery Hofsass
*Assistant Examiner*—Sisay Yacob
(74) *Attorney, Agent, or Firm*—Akerman Senterfitt

(57) ABSTRACT

A method and a device for reading out keys of a keyboard. The read-out is realised by randomly generating a scanning pattern comprising for each row and column a read-out value to be applied on the rows and columns. The scanning pattern is preferably changed after having been applied to the keys. After application of the randomly generated pattern, the verification routine is applied in order to identify the selected keys.

6 Claims, 2 Drawing Sheets

METHOD AND A DEVICE FOR READING OUT KEYBOARD KEYS

CROSS-REFERENCE TO RELATED APPLICATIONS

This application claims priority from, European Application No. 03079008.3 filed 22 Dec. 2003, the disclosure of which is hereby incorporated by reference.

BACKGROUND

The present invention relates to a method for reading out keys of a keyboard, in particular a keyboard of an automatic teller machine, said keys being arranged according to a row and column set-up of a matrix, wherein a first scanning pattern for reading out said keys is applied to said keyboard, said method comprises a first series of steps consisting in:
  randomly generating said first scanning pattern, which comprises for each of said rows and columns a first read out value to be applied onto said row respectively said column;
  applying said first scanning pattern onto said rows and columns during at least a first minimum time period.

The invention relates also to a device for reading out keyboard keys.

Such a method and such a device are known from EP-A-0 368 520. The known method is for example used in automatic teller machines or point-of-sale terminals. The keys are generally set up as rows and columns of a matrix. In order to detect a particular key being activated, the rows and columns are scanned after application of a randomly generated scanning pattern. The detection of a modification in the applied scanning pattern indicates that a key has been activated. Indeed, the activation of a key will cause a cross-link between the row and column on which the selected key is located. By randomly generating the scanning pattern it is more difficult for unauthorised users to pick up the signal of the applied scanning pattern and thus acquire information about the activated keys.

A drawback of the known method or device is that the rows and columns are sequentially scanned and that it is not possible to change the row and column sequence otherwise than among either the columns or the row sequence in itself. This limits the possibilities of masking the data input by means of the keyboard.

SUMMARY

It is an object of the present invention to realise a method and a device for reading out keys of a keyboard where it is even more difficult for an unauthorised user to get access to the data read out from the keyboard.

For this purpose, a method for reading out keys of a keyboard according to the present invention is characterised in that said method further comprises:
  applying a verification routine in order to determine if the actual values of each row and column correspond to those applied by the first scanning pattern and to identify those rows and columns for which the actual value does not correspond to the one applied by the first pattern, said verification routine further comprises a temporary storage of a pointer to said identified rows and columns;
  repeating, after said first time period has lapsed, said first series of steps if no rows and columns have been identified by said verification routine;

said method further comprises a second series of steps which is started after said verification routine has stored said pointer, said second series of steps comprises:
  randomly generating, after said first time period has lapsed, a second scanning pattern comprising for at least each of said rows and columns indicated by said pointer a second read-out value to be applied onto said rows and columns;
  applying said second scanning pattern to said rows and columns during at least a second minimum time period;
  monitoring said identified rows and columns by using said second pattern in order to confirm as activated keys, those keys located on said identified rows and columns.

Because the scanning pattern is randomly generated and changes with subsequent reading operation, it is very difficult and nearly impossible, for an unauthorised user, to recognise the applied scanning pattern. Furthermore, the scanning pattern is applied to the rows and columns, which enables to take into consideration the rows as well as the columns for application of the scanning pattern. Since the pattern can change the rows as well as the columns for subsequent reading operations, it is necessary to apply a first and a second scanning pattern during a first and a second period in order to recognise a selected key. The modification of the scanning pattern applied to the rows as well as the columns makes it very difficult to recognise rows and columns simply from picked-up radiation, as the logic between rows and columns is no longer present in this picked-up radiation.

A first preferred embodiment of a method according to the invention is characterised in that said first and second time period are randomly determined. By randomly determining the first and second time period, not only the applied scanning pattern changes but also the time period during which the pattern is applied. This makes it even more difficult for an unauthorised user to get access to the data of the selected keys as too many parameters change.

A second preferred embodiment of the method according to the present invention is characterised in that said monitoring is interrupted upon establishing that the actual values of the monitored rows and columns correspond to those applied by the second scanning pattern, said interruption being followed by a return to said first series of steps. This would indicate that either the key has been released, or that an error occurred during the preceding step. In any way, this signifies that it is no longer necessary to continue the present monitoring operation. If the key is released it is no longer necessary to verify if the monitored key has been activated. If the key would have been activated by error or due to a disturbance, it is not necessary any more to monitor this key.

The invention also relates to a device for implementing the method.

BRIEF DESCRIPTION OF THE FIGURES

The invention will now be described in more details with respect to the drawings illustrating a preferred embodiment of a method and a device according to the present invention. In the drawings.

Figure 1:
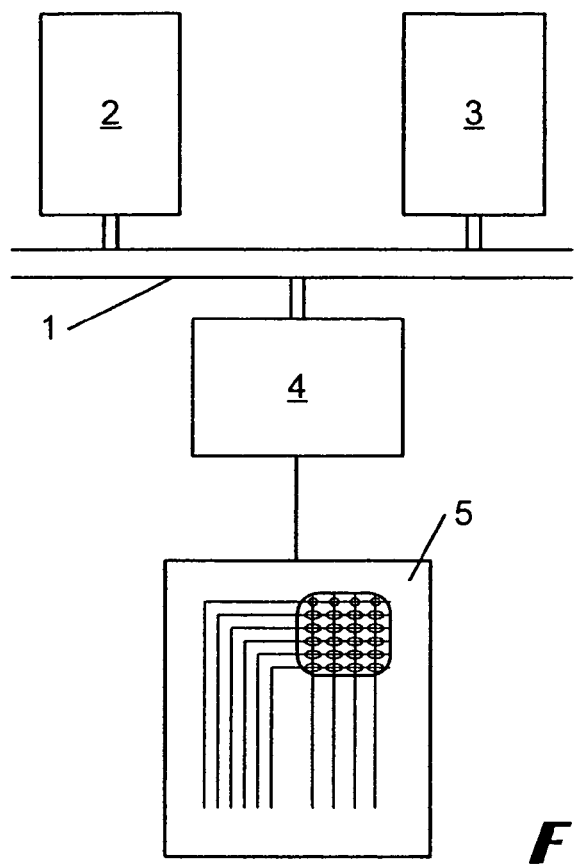
FIG. 1 illustrates schematically a data processing unit having a device for reading out keys of a keyboard.

In the drawings a same reference sign has been allotted to a same or analogous element.

DETAILED DESCRIPTION

The data processing unit shown schematically in FIG. 1 comprises a bus 1 to which a processing member 2, for example a microprocessor, is connected. A memory 3 is further connected to the bus. The memory is provided for storing processing data and programs to be carried out under control of the processing member 3. An interface 4 is also connected to the bus 1. A keyboard 5 is connected to the interface in order to input user data. When the data processing unit is part of an ATM (Automatic Teller Machine) or any terminal provided for processing secure data, the keyboard will be used for entering secure data such as a PIN (Personal Identification Number) code.

Figure 2:
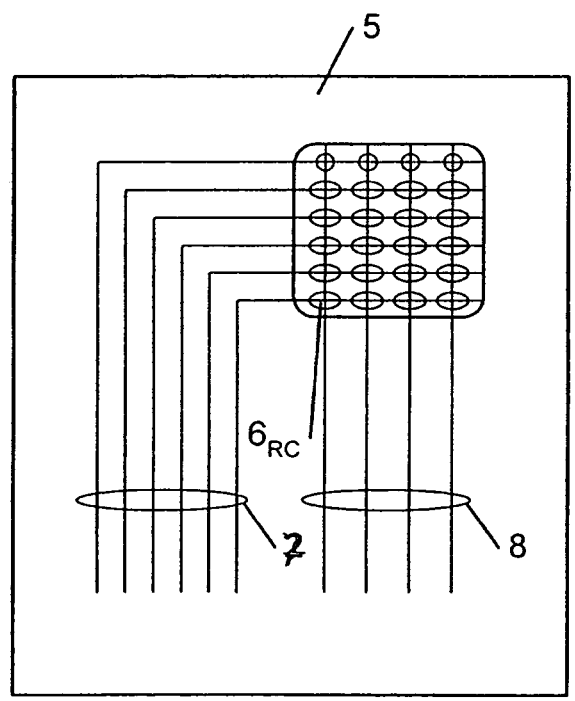
FIG. 2 illustrates a matrix set-up for a keyboard.

As illustrated in FIG. 2, the keys $6r,c$ of the keyboard 5 are arranged according to a row and column set-up of a matrix. The rows are each time connected to a line of the first set of lines 7, whereas the columns are each time connected to a line of the second set of lines 8. The classical manner to read out the keys is to apply a first scanning pattern to the columns and to read out the lines. So, when a key is selected, be it via a pressure applied on the key or via a touch screen, the key will act as a switch connecting to each other the row and the column on which the selected key is located. The latter read-out method is appropriate for data, which need not to be secured. However, for secure data this method is no longer appropriate as it is too easy to pick up the scanning signal from outside and get, in such a manner, access to the secure data. Indeed, the highly systematic way according to which the keys are each time scanned can easily be detected. The subsequently applied identical scanning pattern will work as an antenna signal, which can be picked-up.

In order to apply a more secure read-out method, the present invention proposes to change the scanning pattern applied onto the keys of the keyboard. This change implies that, instead of applying each time for each read-out operation cycle an identical pattern, a different, randomly generated pattern is applied. In the preferred embodiment the applied scanning pattern is each time for each read-out cycle changed by each time generating the pattern randomly. However, the same randomly generated scanning pattern could also be applied during a predetermined number, or even randomly generated number, of subsequent scanning periods. For example during ten subsequent periods a same scanning pattern could be applied. Since the read out periods are generally short, less than 3 seconds, even if the same pattern is applied for a number of subsequent periods, it will still be very difficult to pick up the scanning pattern without a physical intrusion in the keyboard or the processing unit. Nevertheless, if the unauthorised user would try to break open the device, this would generate a tamper condition leading to a neutralisation of the device.

The randomly generated scanning pattern enables to vary a large number of parameters. So, the specific read-out values applied onto the rows or columns can vary, for example between the logic values 0 or 1, or even values higher than logic 1 could be applied. The manner in which the rows and columns are triggered can vary, so for example during one cycle, the rows can be used as input and the columns as output, whereas in a subsequent cycle the columns are used as input and the rows as output. Alternatively, some rows and some columns could be used as input and the remaining ones as output. Furthermore, the time period during which the scanning pattern is applied onto the keys can be changed by randomly generating a time period. Just as for the application of the scanning pattern, also the time period could be the same for a predetermined or randomly determined subsequent number of cycles.

Figure 3:
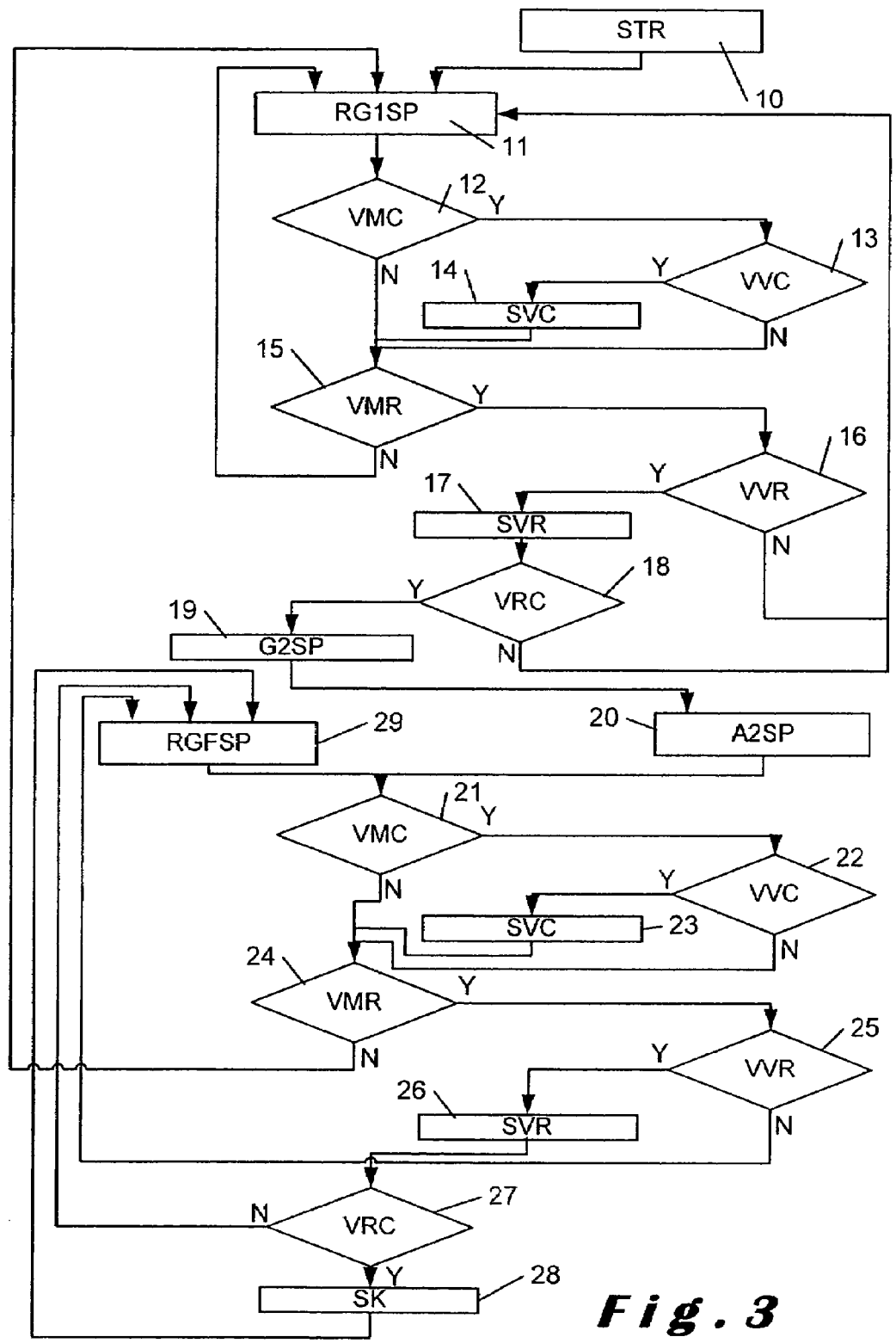
FIG. 3 illustrates by means of a flowchart a preferred embodiment of a method according to the present invention.

The fact that the applied scanning pattern varies requires particular measures for reading out the keys as will be described hereunder with reference to FIG. 3. Under control of the data processing member, the keyboard is placed in a secured mode. This is for example triggered by the insertion of a bank card or by touching one of the keys of the keyboard for initiating an operation. The switch to a secured mode is for example realised by interrupting the normal read-out procedure and by starting the secure procedure by means of an interrupt signal. Once the secured mode is started (10; STR), the processing member will trigger the scanning pattern generator, which comprises a random generator for randomly generating (11; RG1SP) a first scanning pattern and a first minimum time period and apply it during at least said first minimum time period to the keys of the keyboard. It should be noted that the random generation of the first time period is used in a preferred embodiment, as it increases the security level. However the present method is also applicable when a predetermined time period would be used. This minimum period is for example 1 ms and can run until 2 ms. The first scanning pattern comprises for each row and column a first read-out value to be applied onto said rows respectively columns.

After application of the first scanning pattern, the processing member will apply a verification routine by means of a verification member, which is part of the data processing unit. The verification routine, which comprises a first series of steps (11, 12, 13, 14, 15, 16), will first check the columns (12, VMC) in order to verify if the actual value applied onto the columns by the first scanning is still present. Indeed, if no key on the scanned column has been activated (12; N) the actual value on that column will correspond to the one applied by the first scanning pattern. On the other hand, if a key on the scanned column has been activated (12; Y) the actual value will no longer correspond to the one applied by the first scanning pattern, since the activation of the key will have caused a switch between a column and a row, thus leading to a change in the applied value.

If the verification routine has detected that a column has been selected (12; Y) it will verify (13; VVC) if it is a valid column. This is, for example, realised by verifying if the actual value is acceptable within the scope of the applied read-out value or by verifying if at the present stage of the operation the verified column should be active. So, for example, the OK key could have been selected by error upon entering a PIN code. If the column corresponding to the OK key would then have been identified, it would nevertheless not be considered as a valid column at this stage as only columns linked to number keys are considered valid.

If the selected column is considered as valid, a counter for the identified column is incremented and there is checked whether the amount indicated by the counter has reached a predetermined number. This predetermined number will depend on the time period during which the first pattern is applied. The shorter the time period is, the higher will be the number. If the counter has reached the predetermined number (13, Y), the considered column is identified (14; SVC) as being a valid column and this identification data is stored temporarily in the memory. If, on the other hand, the counter did not reach (13,N) the predetermined number, the column is not identified as a valid column. The use of a counter allows repeating the verification routine several times, thereby increasing the reliability of the key identification. The verification routine is repeated either by using the same first scanning pattern a number of times or by generating randomly each time a new scanning pattern and a new time period.

An analogous operation is thereafter realised for the rows of the keyboard (15; VMR), (16; VVR) and (17; SVR). If a valid row is identified this will lead to the identification (17; SVR) of a valid row. If no valid rows and columns have been identified, the first series of steps of the routine is repeated as from step 11.

Once a row has been identified, it is checked by the verification routine (18; VRC) if both a row and column have been identified. This is for example realised by reading the memory in which the identified row and column are stored. If this is the case, a pointer to the identified row and column and thus to the identified key is stored (19, G2SP). If no valid row or column has been identified, the first series of steps is repeated.

Since the pattern changes, the read-out routine will need, once a row and a column have been identified and a pointer stored, a second series of steps in order to unambiguously determine the activated key. If a pointer has been stored, a second scanning pattern is generated and applied (20; A2SP) to the keys during a second minimum time period. In an analogous manner as for the first series of steps, the second scanning pattern is randomly generated and preferably the second minimum time period too. Steps 21 (VMC), 22 (VVC), 23 (SVC), 24 (VMR), 25 (VVR), 26 (SVR) and 27 (VRC) are analogous to the steps 12, 13, 14, 15, 16, 17 and 18 of the first series, with the difference, however, that now the second scanning pattern and the second time period are used. Furthermore only the rows and columns pointed to are preferably taken into consideration. It could however also be possible to apply the second series to all rows and columns.

As described before with respect to the first scanning pattern, it is verified if a valid column and row can be identified. This is used in order to monitor if the key pointed to by the pointers is still activated. When the monitoring routine establishes that no valid row or column can be identified (21; N) and (25; N), the routine is started again as from (11; RG1SP). When the monitoring routine establishes, on the other hand, that a valid row and column can be identified, the monitoring routine is restarted and a further scanning pattern is generated (29; RGFSP) and applied to the pointed key for a further minimum time period. This restart is repeated until the counter has reached its predetermined value.

If it has been established that the key pointed to is again identified using the monitoring routine, the key is confirmed as activated (28; SK) and this information is supplied to the processing member for further processing.

Under the monitoring routine it would also be possible to use the release of the pointed key as a way to confirm that the pointed key has been activated. This could be realised by verifying if, for the key pointed to, the actual value corresponds to the applied value. Indeed if the pointed key has been released the key no longer acts as a switch and the applied scanning pattern will be recognised. Thus the presence of the applied scanning pattern is an indication that the pointed key has been released.

The invention claimed is:

1. A method for reading out keys of a keyboard, in particular a keyboard of an automatic teller machine, said keys being arranged according to a row and column set-up of a matrix, wherein a first scanning pattern for reading out said keys is applied to said keyboard, said method comprises a first series of steps consisting of:

(a) randomly generating said first scanning pattern, which comprises for each of said rows and columns a first read-out value to be applied onto said row respectively said column;
(b) applying said first scanning pattern onto said rows and columns during at least a first minimum time period;
(c) applying a verification routine in order to determine if the actual values of each row and column correspond to those applied by the first scanning pattern and to identify those rows and columns for which the actual value does not correspond to the one applied by the first pattern,
(d) repeating, after said first time period has lapsed, said first series of steps if no rows and columns have been identified by said verification routine;
characterised in that said method further comprises;
(e) temporarily storing a pointer pointing to said rows and columns identified during said verification routine;
(f) applying a second series of steps which is started after storing said pointer, said second series of steps comprises:
(g) randomly generating, after said first time period has lapsed, a second scanning pattern comprising for at least each of said rows and columns indicated by said pointer a second read-out value to be applied onto said rows and columns;
(h) applying said second scanning pattern to said rows and columns during at least a second minimum time period;
(i) monitoring said identified rows and columns by using said second pattern in order to confirm as activated keys those keys located on said identified rows and columns.

2. A method as claimed in claim 1, characterised in that said first and second time period are randomly determined.

3. A method as claimed in claim 1, characterised in that said first series of steps is subsequently applied for a predetermined number of times, each time that the verification routine identifies a row and a column during said subsequent application of the first series of steps a counter is incremented for the identified row and column, said counter being provided for generating a storage signal upon reaching a predetermined number, said pointer being stored under control of said storage signal.

4. A method as claimed in claim 1, characterised in that said monitoring is interrupted upon establishing that the actual values of the monitored rows and columns correspond to those applied by the second scanning pattern, said interruption being followed by a return to said first series of steps.

5. A method as claimed in claim 1, characterised in that said confirmation is realised by applying a further verification routine in order to determine if the actual values of at least those rows and columns indicated by said pointers correspond to those values applied by the second scanning pattern and to identify those rows and columns for which the actual value does not correspond to the one applied by the second pattern.

6. A device for reading out keys of a keyboard, in particular a keyboard of an automatic teller machine, said keys being arranged according to a row and column set-up of a matrix, said device comprising a scanning pattern generator provided for generating a first scanning pattern allowing to readout said keys, said device also comprises first means for applying said first scanning pattern to said keys during at least a first minimum time period, said device further comprises a random generator provided for randomly generating said first scanning pattern, which comprises for each of said rows and columns a first read-out value to be applied onto said row respectively said column, said device also comprises a verification member provided for applying a verification routine which comprises a verification if the actual value of each row and column corresponds to the one applied by the first pattern and an identification of those rows and columns for which the actual value does not correspond to the one applied by the first pattern, characterised in that said verification routine further comprises a temporary storage of a pointer to said identified rows and columns and their actual value, said scanning pattern generator being further provided for generating randomly, after said first time period has lapsed, a second scanning pattern comprising, for at least each of said rows and columns indicated by said pointer a second read-out value to be applied onto said row respectively said column, said first means being also provided for applying said second scanning pattern onto said keys during at least a second minimum time period, said verification member being further provided for monitoring said identified rows and columns by using said second pattern in order to confirm as activated keys those keys located on said identified rows and columns.

* * * * *